United States Patent
Savage

(10) Patent No.: US 6,313,668 B1
(45) Date of Patent: Nov. 6, 2001

(54) PASSIVE SAMPLE AND HOLD IN AN ACTIVE SWITCHED CAPACITOR CIRCUIT

(75) Inventor: Scott C. Savage, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/536,527

(22) Filed: Mar. 28, 2000

(51) Int. Cl.$^7$ .............. G11C 27/02; H03K 5/00; H03K 17/00
(52) U.S. Cl. .............. 327/94; 327/91; 327/337; 327/554
(58) Field of Search .............. 327/91, 94, 337, 327/554, 95, 96; 330/9

(56) References Cited

U.S. PATENT DOCUMENTS

| | | | |
|---|---|---|---|
| 4,322,697 | * 3/1982 | Carbrey | 327/554 |
| 4,333,064 | * 6/1982 | Kato et al. | 327/554 |
| 4,375,625 | * 3/1983 | Lee | 327/554 |
| 4,604,584 | * 8/1986 | Kelley | 327/91 |
| 5,281,860 | * 1/1994 | Krenik et al. | 327/91 |
| 5,481,212 | * 1/1996 | Shima | 327/94 |
| 5,506,526 | * 4/1996 | Seesink | 327/91 |
| 5,698,999 | * 12/1997 | Etoh et al. | 327/94 |
| 5,714,894 | * 2/1998 | Redman-White et al. | 327/94 |
| 5,986,599 | * 11/1999 | Matsuo | 327/94 |
| 6,052,000 | * 4/2000 | Nagaraj | 327/94 |
| 6,169,427 | * 1/2001 | Brandt | 327/94 |

* cited by examiner

Primary Examiner—Terry D. Cunningham
Assistant Examiner—Long Nguyen

(57) ABSTRACT

A sample and hold in a switched capacitor circuit with frequency shaping. The sample and hold does not require a pair of large area, power-consuming operational amplifiers and, as such, consumes less power and less area. Preferably, the sample and hold is operable in four different states wherein a different set of switches are closed in each of the four states. The switches are controlled by two clock signals and a plurality of signals derived from the two clock signals, such as four signals derived from the two clock signals. Desirably, the sample and hold with frequency shaping is configured to sample a voltage across a first capacitor while a second capacitor is disconnected from said first capacitor, and is configured to thereafter connect the second capacitor to the first capacitor and possibly discharge at least a portion of a charge held in the first capacitor into the second capacitor.

9 Claims, 9 Drawing Sheets

PASSIVE SAMPLE AND HOLD IN AN ACTIVE SWITCHED CAPACITOR CIRCUIT

BACKGROUND OF THE INVENTION

Each capacitor in a switched capacitor circuit can be described as acting either as a capacitor or as a resistor. A capacitor in a switched capacitor circuit is said to act as a capacitor when the capacitor has memory of a previous value, and passes current that is proportional to dv/dt (i.e., I (current)=Cdv/dt). Such a capacitor generally performs some type of frequency shaping because the capacitor passes more and more current as the frequency of the voltage increases across the terminals of the capacitor. In contrast, a capacitor in a switched capacitor circuit is said to act as a resistor when the capacitor has no memory of a previous value, and passes current that is proportional to a voltage (i.e., V=iR (voltage=current*resistance), or equivalently I=CV/T (wherein T is the period of a sampling clock)).

Unlike with a capacitor, the value of the current passed by a true resistor is independent of the frequency of the input signal. FIG. 1 illustrates a circuit 20 wherein the capacitor 22 therein is said to act as a capacitor—i.e., the capacitor passes more current as the frequency of the input signal, $V_{in}$, increases. Hence, the current (i) provided to the capacitor is equal to C*dv/dt. In contrast, FIG. 2 illustrates a circuit 30 wherein the capacitor 32 therein is said to act as a resistor— i.e., the capacitor passes a current proportional to the magnitude of the input signal, $V_{in}$. Hence, the current (i) provided to the capacitor is equal to CV/T. In FIG. 2, the waveforms of two non-overlapping clock signals, clk1 and clk2, are depicted under the circuit 30. While clock signal clk1 controls switch 1 in the circuit, clock signal clk2 controls switch 2.

It is generally advantageous in discrete time frequency shaping circuits to use circuits that have minimal attenuation and provide feedthrough isolation between samples (wherein $v_{out}$ is not directly coupled to $v_{in}$). FIG. 3 illustrates a typical continuous-time analogous circuit 40 wherein the circuit 40 includes a feedthrough isolation sample and hold portion 42 in front. A corresponding discrete-time analogous circuit 50 is illustrated in FIG. 4, and is provided by replacing each resistor shown in FIG. 3 with a capacitor and providing switches that move i=CV/T. In FIG. 4, the capacitor $C_{shape}$ still acts as a capacitor, and passes current that is proportional to dv/dt (i.e., i (current)=Cdv/dt).

FIG. 4 also illustrates the structure of the sample and hold portion of the circuit. As shown, while the resistive-type capacitors, $C_g$ and $C_f$, in the zero portion already have direct feedthrough isolation, capacitor $C_{shape}$ does not have direct feedthrough isolation without the sample and hold circuit in front. Adding a switch in front of capacitor $C_{shape}$ (instead of providing the sample and hold portion) will not provide direct feedthrough isolation because when the switch is closed, $v_{in}$ will directly change $v_{out}$. FIG. 4 illustrates the traditional method of implementing the required sample and hold function. As shown, two active stages are implemented (the sample and hold portion and the zero portion), and each requires a large area, power-consuming operational amplifier. However, it is advantageous to limit the area of a circuit as well as limit the power consumed by a circuit. For example, with regard to Ethernet chips, as the number of required ports (i.e., channels) continue to increase, package power dissipation is becoming more and more of a critical issue. Cutting power consumption, such as in half, for a stage in a circuit is significant because more ports (i.e., channels) can be added to the same chip while maintaining safe die temperatures.

OBJECTS AND SUMMARY

It is an object of an embodiment of the present invention to provide a switched capacitor circuit that is configured to perform a sample and hold with frequency shaping operation while consuming less power.

It is a further object of an embodiment of the present invention to provide a switched capacitor circuit that is configured to perform a sample and hold with frequency shaping operation, and consumes less area.

It is a further object of an embodiment of the present invention to provide a switched capacitor circuit that includes passive elements configured to perform a sample and hold operation.

Briefly, and in accordance with at least one of the foregoing objects, an embodiment of the present invention provides a passive sample and hold for an active switched capacitor circuit that employs frequency shaping. The sample and hold does not require a pair of large area, power-consuming operational amplifiers and, as such, consumes less power and less area than conventional sample and hold circuits.

Preferably, the sample and hold is operable in four different states wherein a different set of switches are closed in each of the four states. Preferably, the switches are controlled by two clock signals and a plurality of signals derived from the two clock signals, such as four signals derived from the two clock signals. Desirably, the sample and hold is configured to sample a voltage across a first capacitor while a second capacitor is disconnected from said first capacitor, and is configured to thereafter connect the second capacitor to the first capacitor and discharge at least a portion of a charge held in the first capacitor into the second capacitor. As such, a sample operation is performed when the second capacitor is disconnected from the first capacitor and a hold operation is performed after the second capacitor is connected to the first capacitor.

BRIEF DESCRIPTION OF THE DRAWINGS

The present invention and the advantages thereof will become more apparent upon consideration of the following detailed description when taken in conjunction with the accompanying drawings of which.

DETAILED DESCRIPTION OF AN EMBODIMENT OF THE INVENTION

Figure 1:
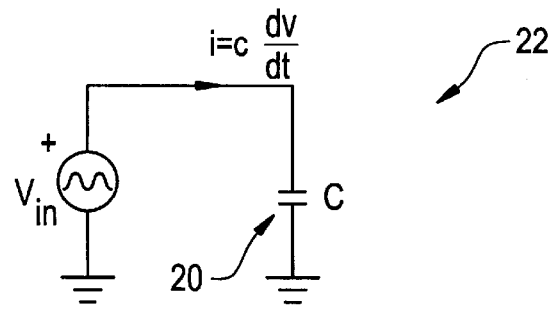
FIG. 1 is a circuit diagram illustrating a circuit in which a capacitor acts as a capacitor.
Figure 2:
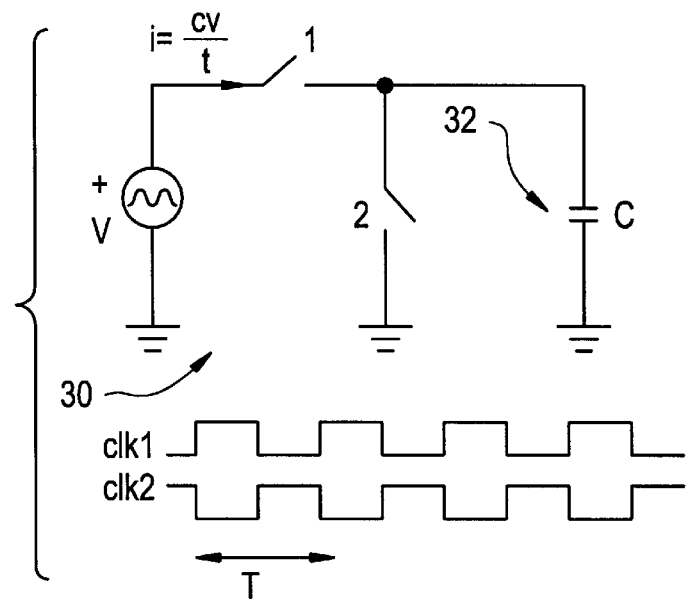
FIG. 2 illustrates a circuit in which a capacitor acts as a resistor, and illustrates a pair of waveforms corresponding to clock signal which control the switches of the circuit.
Figure 3:
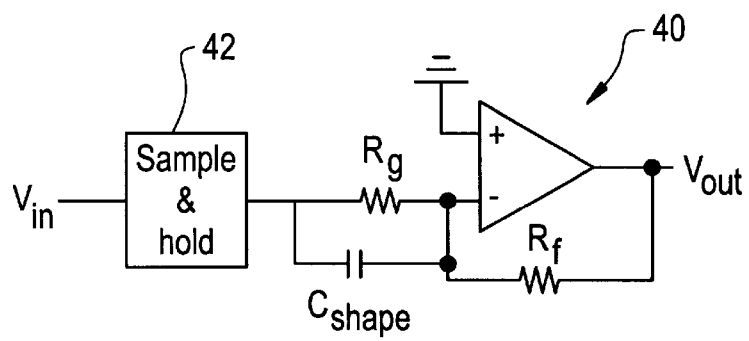
FIG. 3 is a circuit diagram illustrating a continuous-time analogous circuit, wherein the circuit includes a feedthrough isolation sample and hold portion in front.
Figure 4:
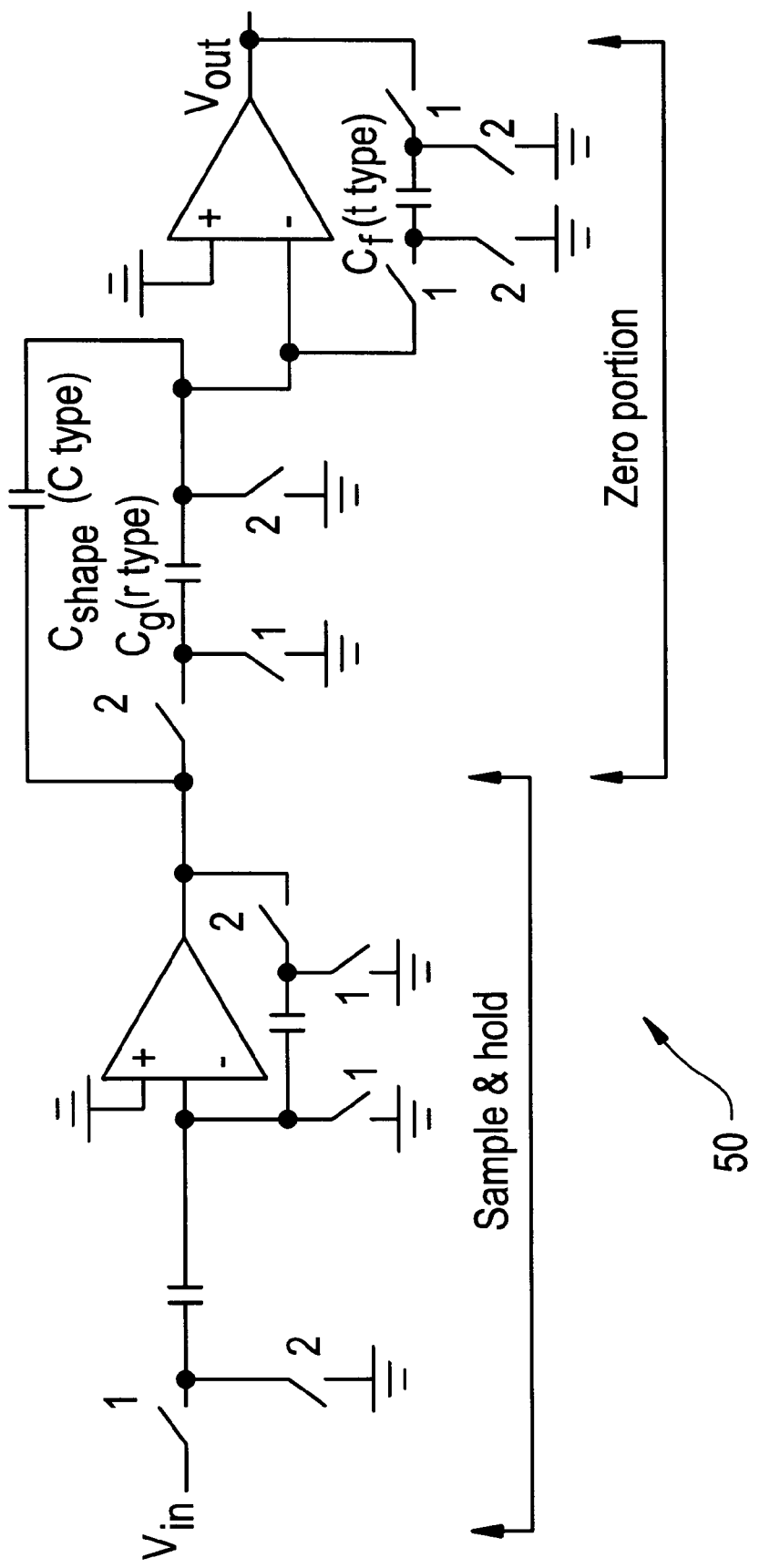
FIG. 4 is a circuit diagram illustrating a discrete-time analogous circuit corresponding the circuit illustrated in FIG. 3.
Figure 5:
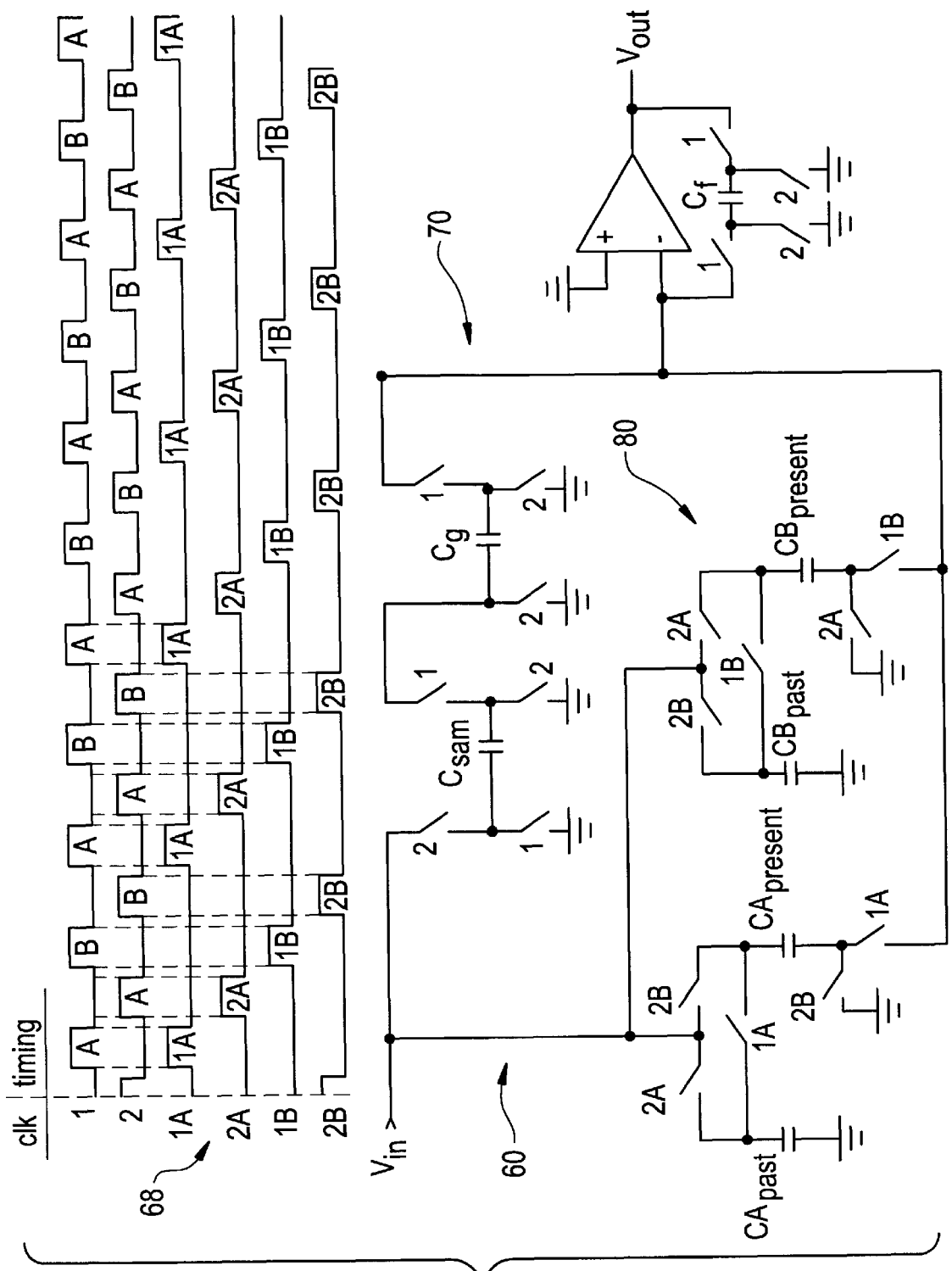
FIG. 5 illustrates a switched capacitor circuit including a sample and hold in accordance with an embodiment of the present invention, and illustrates waveforms corresponding to clock signals which control the switches of the circuit.

FIG. 5 illustrates a switched capacitor circuit 60 including a sample and hold in accordance with an embodiment of the present invention. The sample and hold does not require a pair of large area, power-consuming operational amplifiers and, as such, consumes less power and less area.

Also shown in FIG. 5 are waveforms 68 corresponding to clock signals which control the switches included in the circuit. Specifically, waveforms corresponding to two clock signals, "1" and "2", are illustrated, and waveforms corresponding to other four signals, "1A", "2A", "1B" and "2B", that are derived from clock signals "1" and "2" are shown. Preferably, clock signals "1" and "2" are approximately 48% duty cycle, non-overlapping clock signals, and clock signals "1A", "2A", "1B" and "2B" are approximately 24% duty cycle, non-overlapping clock signals derived from clock signals "1" and "2". It should be noted that the "B" in "1B" and "2B" does not indicate a complement signal or "bar." The circuit illustrated in FIG. 5 is configured such that clock signals "1" and "2", and signals "1A", "2A", "1B" and "2B" control the switches included in the circuit. Specifically, clock signal "1" controls any switches labeled with a "1", clock signal "2" controls any switches labeled with a "2", signal "1A" controls any switches labeled with a "1A", signal "2A" controls any switches labeled with a "2A", etc.

As such, there are effectively six different clock signals which control the switches of the circuit shown in FIG. 5. However, as indicated by the waveforms shown in FIG. 5, there are four different states. This is because signal "1A" is asserted high every other time signal "1" is asserted high, and signal "1B" is asserted high every other time signal "1" is asserted high. As shown, signals "1A" and "1B" alternate going high each time signal "1" is asserted high. Likewise, signal "2A" is asserted high every other time signal "2" is asserted high, and signal "2B" is asserted high every other time signal "2" goes high. As shown, signals "2A" and "2B" alternate going high each time signal "2" is asserted high. Hence, as shown in FIG. 5, there are four individual states which proceed in the following order:

State #1) signals "1" and "1A" are asserted high;
State #2) signals "2" and "2A" are asserted high;
State #3) signals "1" and "1B" are asserted high; and
State #4) signals "2" and "2B" are asserted high.

A given switch in the circuit shown in FIG. 5 is closed and conductive when its respective control signal is asserted high, and is open when its respective control signal is low. Hence, during state #1, wherein signals "1" and "1A" are asserted high, the switches in the circuit identified "1" and "1A" are closed, and all the other switches are open. Likewise, during state #2, wherein signals "2" and "2A" are asserted high, the switches in the circuit identified "2" and "2A" are closed, and all the other switches are open. During state #3, wherein signals "1" and "1B" are asserted high, the switches in the circuit identified "1" and "1B" are closed, and all the other switches are open. During state #4, wherein signals "2" and "2B" are asserted high, the switches in the circuit identified "2" and "2B" are closed, and all the other switches are open. Hence, there are four different states of the circuit illustrated in FIG. 5. Each of the four states will now be described in order to describe the sample and hold function of the circuit.

Figure 6:
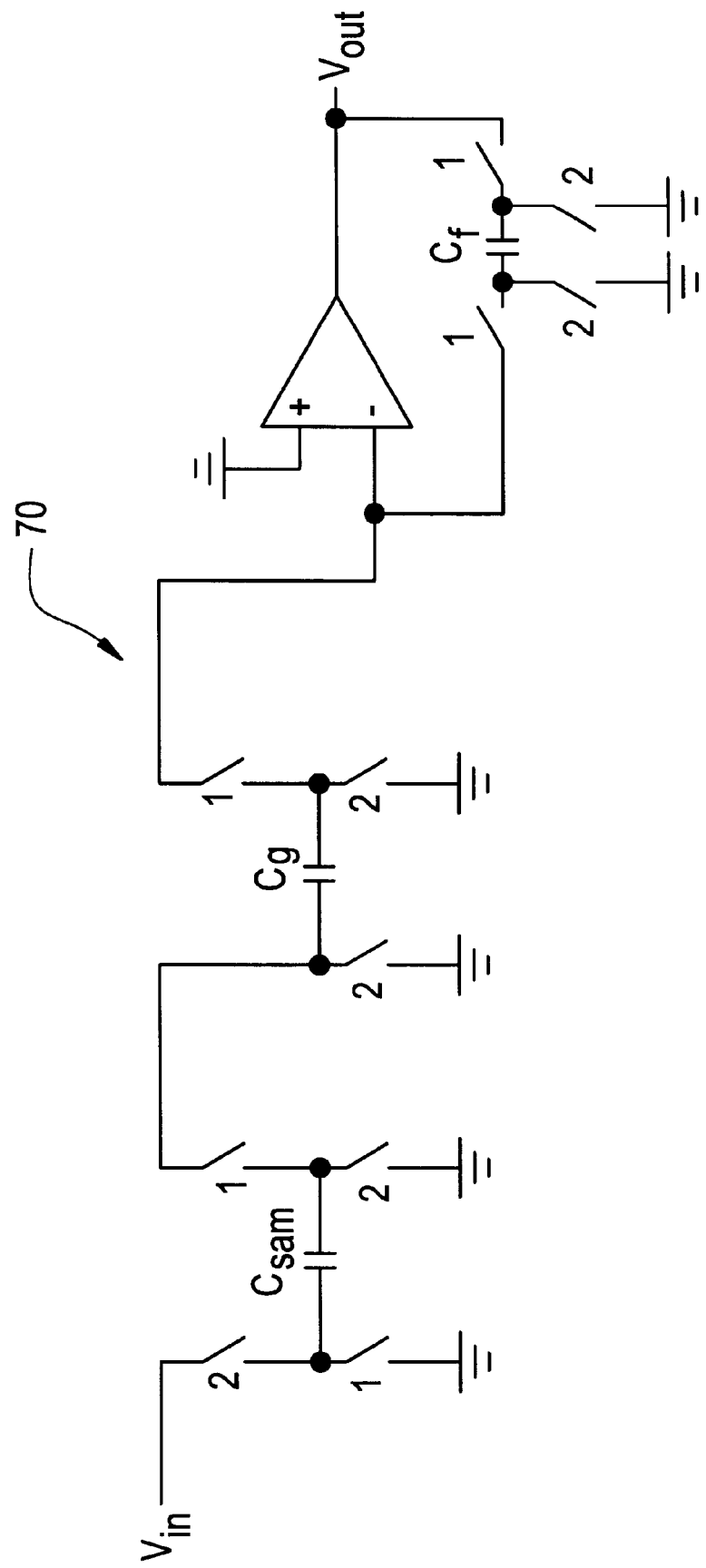
FIG. 6 illustrates the "resistive-type" portion of the circuit shown in FIG. 5.
Figure 9:
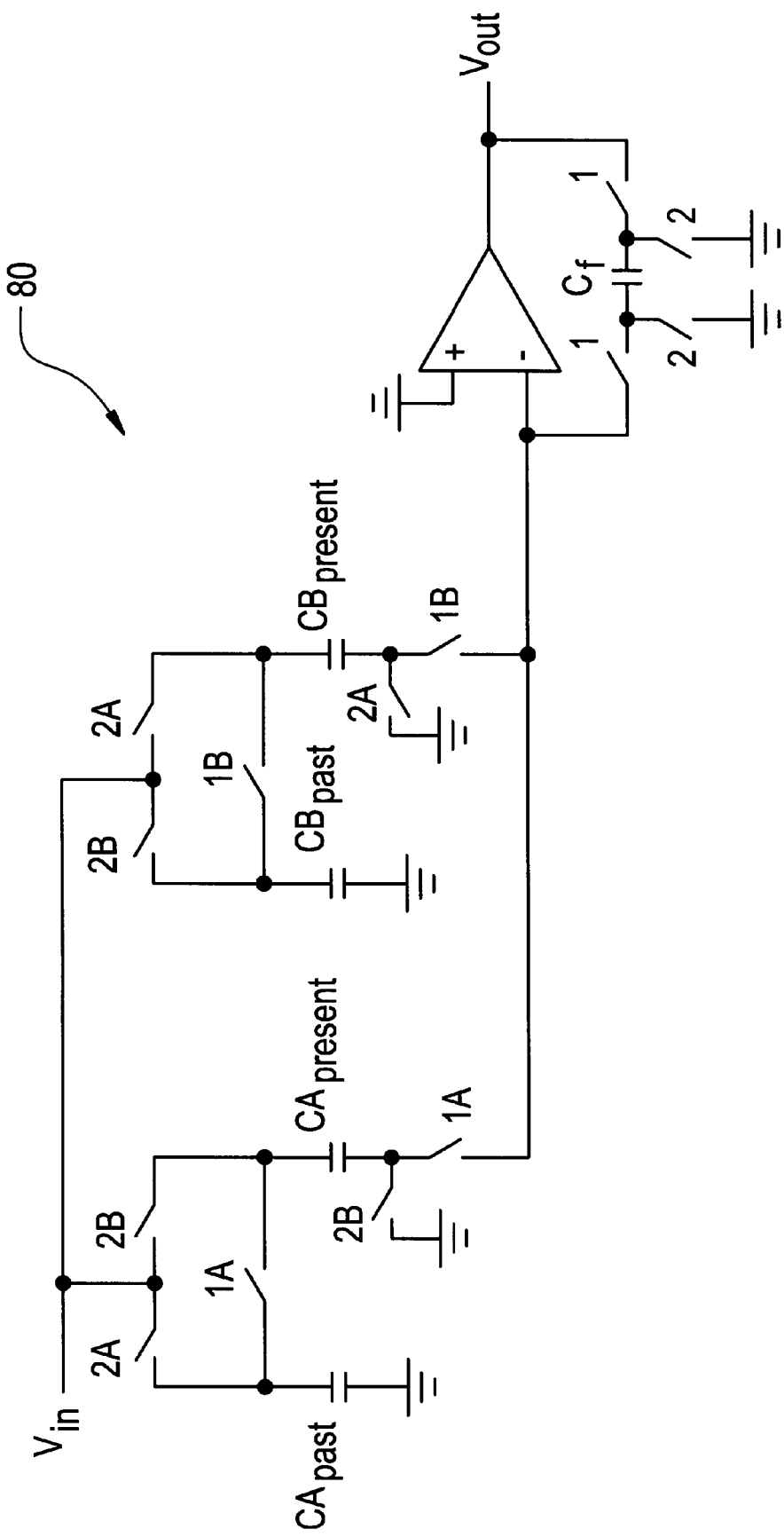
FIG. 9 illustrates the "frequency-shaping-type" portion of the circuit shown in FIG. 5.

The circuit 60 includes a "resistive-type" portion 70, which includes capacitors—$C_{sam}$ and $C_g$—that act effectively as resistors (as discussed above), and a "frequency-shaping-type" portion 80, which includes capacitors—$CA_{present}$, $CA_{past}$, $CB_{present}$, $CB_{past}$—that act effectively as capacitors (as discussed above). The "resistive-type" portion 70 of the circuit is shown in FIG. 6, and the "frequency-shaping-type" portion 80 of the circuit is shown in FIG. 9. As shown, preferably the "resistive-type" portion 70 of the circuit is smaller and consumes less power than does the "frequency-shaping-type" portion 80 of the circuit.

Figure 7:
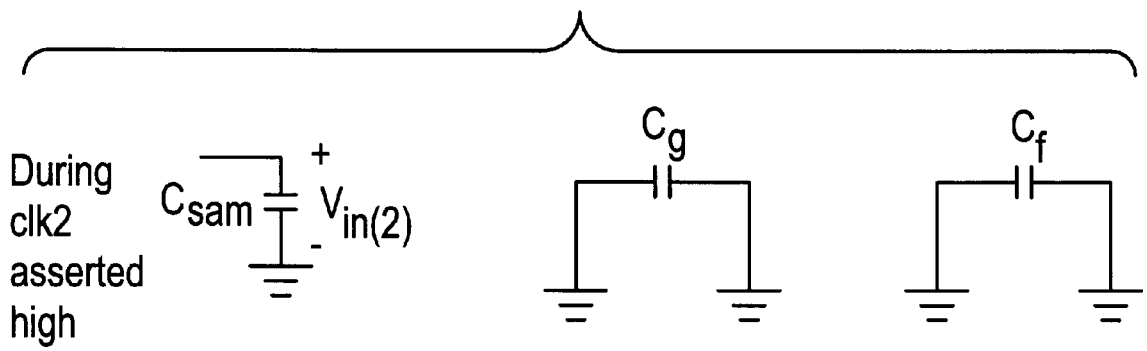
FIGS. 7 and 8 illustrate the different states of the circuit portion shown in FIG. 6.
Figure 8:
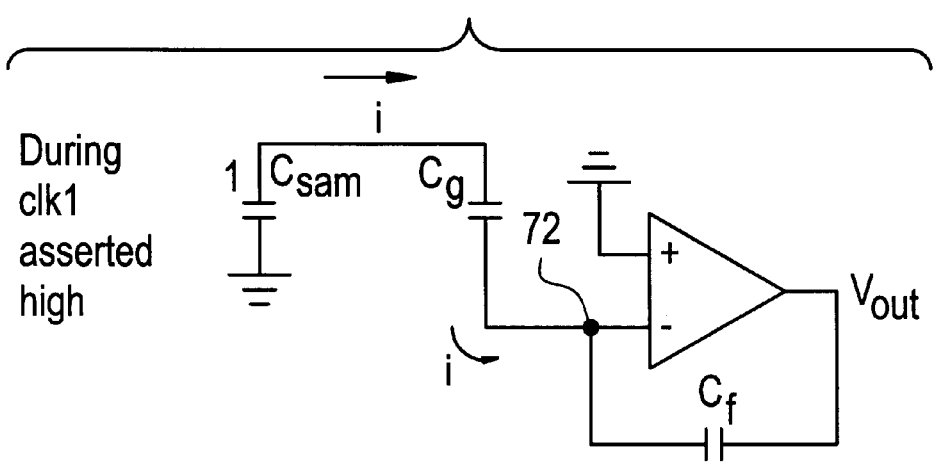

The "resistive-type" portion 70 of the circuit effectively has two alternating states—one state wherein a sample operation is performed, and one state wherein a hold operation is performed. FIG. 7 depicts one state (the sample operation), and FIG. 8 depicts the other state (the hold operation). The switches labeled "1" in FIG. 6 (and FIG. 5) are closed and conductive whenever clock signal "1" is asserted high, and the switches labeled "2" in FIG. 6 (and FIG. 5) are closed and conductive whenever clock signal "2" is asserted high. When clock signal "2" is asserted high (during states #2 and #4, as discussed above), the circuit portion shown in FIG. 6 provides that which is shown in FIG. 7, wherein $V_{in}$ is sampled across $C_{sam}$, and $C_g$ and $C_f$ are effectively shorted to ground. Subsequently, when clock signal "1" is asserted high (during states #1 and #3, as discussed above), the circuit portion shown in FIG. 6 provides that which is shown in FIG. 8, wherein $C_{sam}$ discharges through $C_g$ into $C_f$ until the voltage across $C_{sam}$ is equal to the voltage across $C_g$. If $C_{sam}=C_g$, the voltage across $C_{sam}$ and $C_g$ will be equal at $V_{in}/2$ (and $-V_{in}/2$), and assuming $C_f=C_g=C_{sam}$, then $V_{out}=-V_{in}/2$. Hence, the circuit portion shown in FIG. 6 provides that a sample operation is performed when clock "2" is asserted high (see FIG. 7), and the charge held by $C_{sam}$ is transferred to $C_g$ and $C_f$ and held when clock "1" is asserted high (see FIG. 8). In FIG. 8, the current (i) flowing into summing node 72 equals CV/T. Hence:

$$i=CV/T=(C/2)*(V_n/T),$$

and $$V_{out}=i*R=i*(T/C)=((C/2)*(V_{in}/T))*(T/C)=-V_{in}/2,$$

and $V_{out}$ is proportional to $V_{in}$. If $V_{in}$ is constant, the same current flows into the summing node 72 each time clk1 is asserted high (hence, there is resistor-like behavior).

The "frequency-shaping-type" portion 80 shown in FIG. 9 effectively has four alternating states—two states wherein a sample operation is performed (2A, 2B), and two states wherein a hold/averaging operation is performed (1A, 1B). The four different states are effectively depicted in FIGS. 10–13. As discussed above, the switches labeled "1A" in FIG. 9 (and FIG. 5) are closed and conductive whenever clock signal "1A" is asserted high, the switches labeled "1B" are closed and conductive whenever clock signal "1B" is asserted high, the switches labeled "2A" are closed and conductive whenever clock signal "2A" is asserted high, and the switches labeled "2B" are closed and conductive whenever clock signal "2B" is asserted high.

Figure 10:
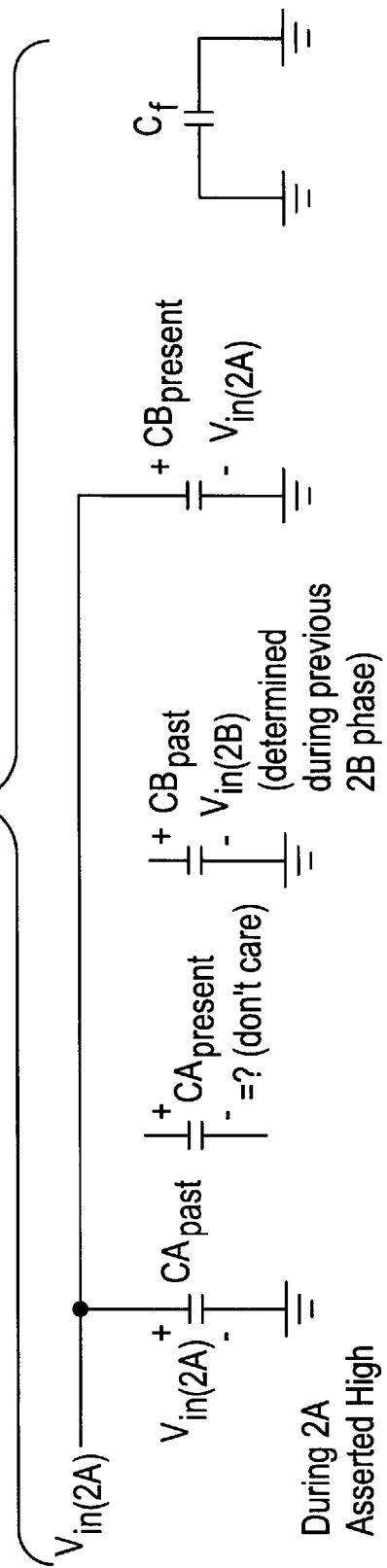
FIGS. 10–13 illustrate the different states of the circuit portion shown in FIG. 9.
Figure 11:
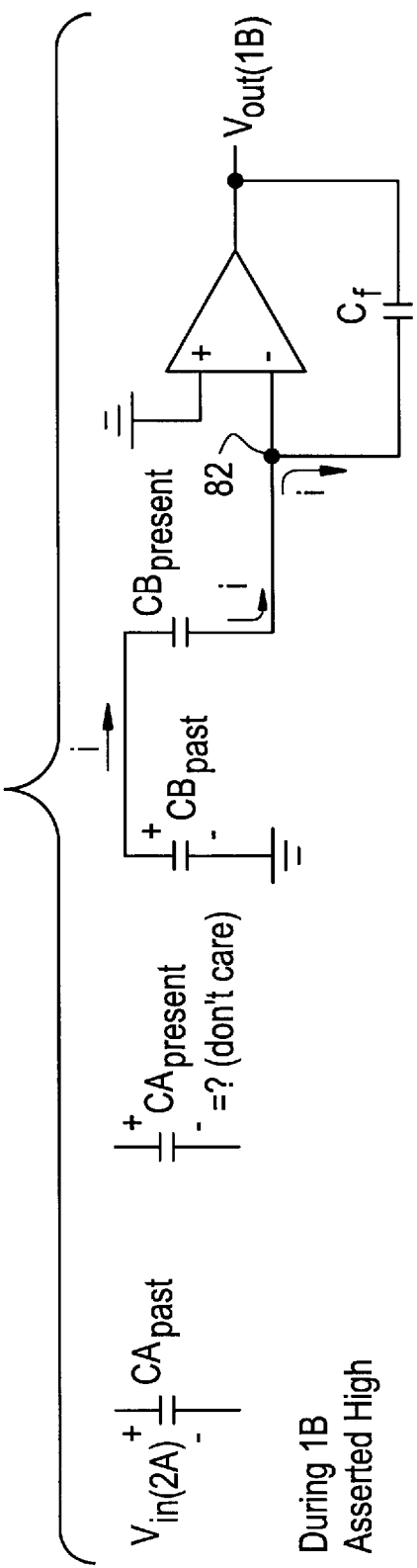

When clock signal "2A" is asserted high (during state #2, as discussed above), the circuit portion 80 shown in FIG. 9 provides that which is shown in FIG. 10, wherein $V_{in}$ is sampled across $CA_{past}$ and $CB_{present}$, and $C_f$ is effectively shorted to ground. Subsequently, when clock signal "1B" is asserted high (during state #3, as discussed above), the circuit portion 80 shown in FIG. 9 provides that which is shown in FIG. 11, wherein $CB_{past}$ (the voltage thereof being determined when clock signal "2B" is asserted high) discharges through $CB_{present}$ (the voltage thereof being determined when clock signal "2A" was asserted high) into $C_f$ until the voltage across $CB_{past}$ and $CB_{present}$ are averaged and equal. In FIG. 11, the current (i) flowing into summing node 82 equals C*dv/dt. Hence:

$$i=(C*V_{in}(2B)-V_{in}(2A))/2,$$

and $$dV_{out}/dt=i/C=½*(V_{in}(2B)-V_{in}(2A)),$$

and $V_{out}$ is proportional to the rate of change of $V_{in}$. If $V_{in}$ does not change, no current flows into the summing node 82 (hence, there is frequency-shaping-type behavior).

Figure 12:
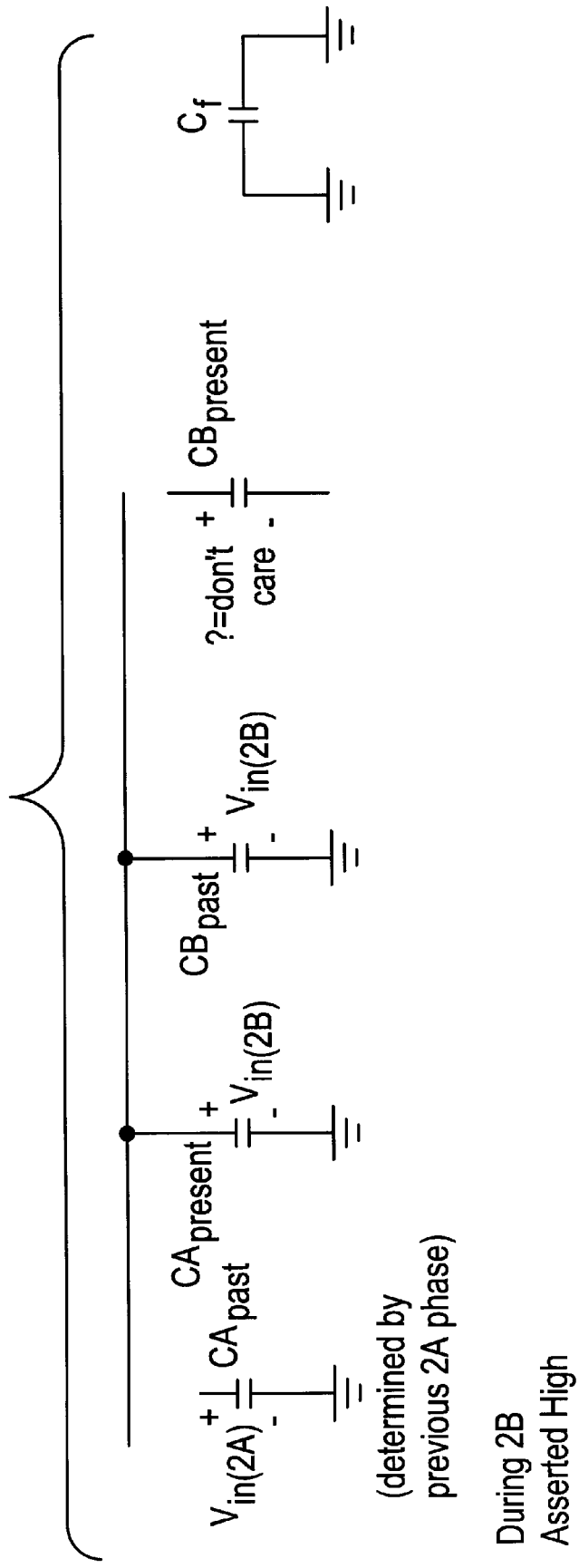
Figure 13:
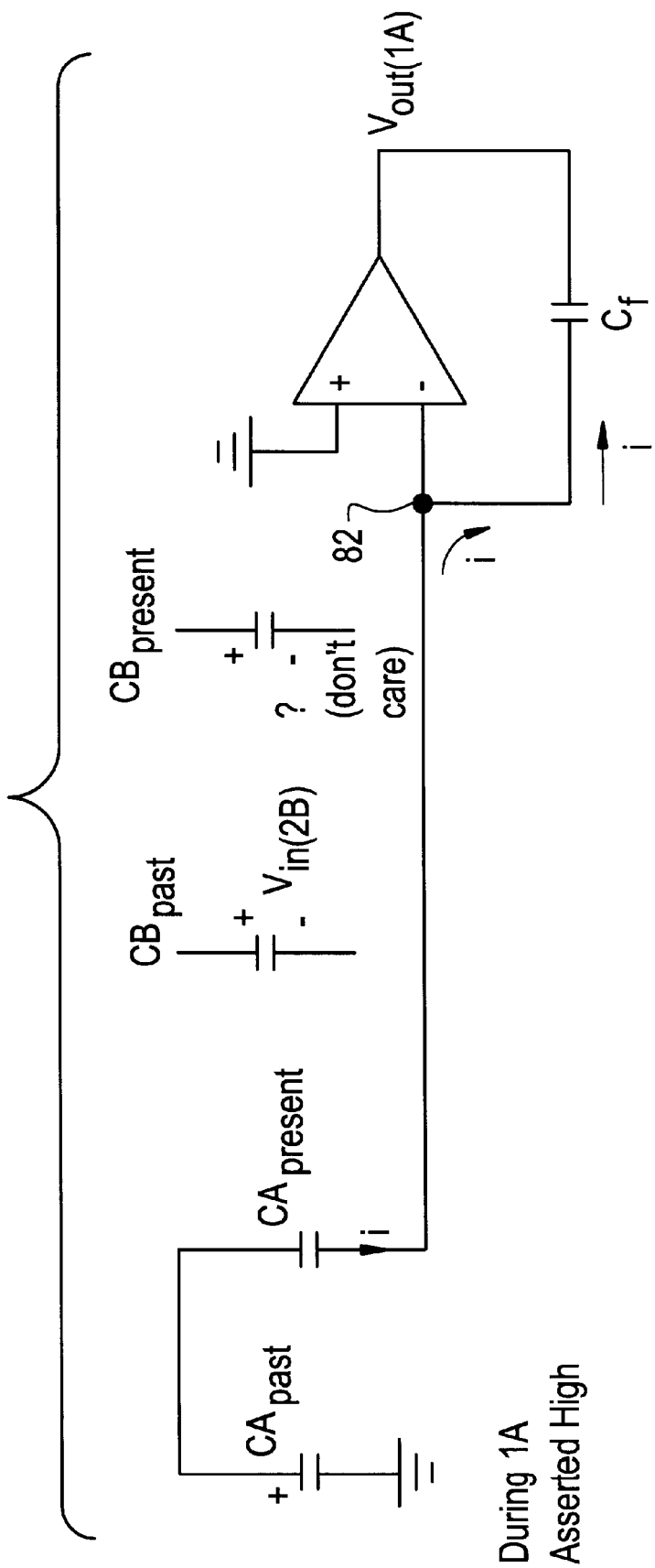

When clock signal "2B" is asserted high (during state #4, as discussed above), the circuit portion 80 shown in FIG. 9 provides that which is shown in FIG. 12, wherein $V_{in}$ is sampled across $CA_{present}$ and $CB_{past}$, and $C_f$ is effectively shorted to ground. Subsequently, when clock signal "1A" is asserted high (during state #1, as discussed above), the circuit portion 80 shown in FIG. 9 provides that which is shown in FIG. 13, wherein $CA_{past}$ (the voltage thereof being determined when clock signal "2A" is asserted high, as described above) discharges through $CA_{present}$ (the voltage thereof being determined when clock signal "2B" was asserted high) into $C_f$ until the voltage across $CA_{past}$ and $CA_{present}$ are averaged and equal. In FIG. 13, the current (i) flowing into summing node equals C*dv/dt. Hence:

$$i=(C*V_{in}(2A)-V_{in}(2B))/2,$$

and $$dV_{out}/dt=i/C=½*(V_{in}(2A)-V_{in}(2B)),$$

and $V_{out}$ is proportional to the rate of change of $V_{in}$. If $V_{in}$ does not change, no current flows into the summing node 82 (hence, there is frequency-shaping-type behavior).

The circuit portion 80 shown in FIG. 9 provides that $CB_{past}$ and $CB_{present}$ sample $V_{in}$ when clock signals "2B" and "2A", respectively, are asserted high, average half of delta $V_{in}$ from when "2B" and "2A" were asserted high. Then, while "clock signal "1B" is asserted high, effectively transform the delta $V_{in}$ voltage into a current, and hold ½ of delta $V_{in}$ when clock signal "1B" is asserted high. The combination of the currents generated by both the resistive-type and frequency-shaping-type capacitors of the circuit illustrated in FIG. 5 produce a sample and hold function with high frequency boost. Both the resistive-type and frequency-shaping-type capacitors attenuate $V_{in}$ (If all the capacitors have equal values, attenuation=−6 dB). Of course, the values of the capacitors can be chosen with some other ratios such that attenuation is less than 1 dB (for example, where $C_{sam}=10*C_g$).

The circuit illustrated in FIG. 5 (and FIGS. 6 and 9) is configured to perform a sample and hold with frequency shaping using passive elements, and without having to use an additional operational amplifier. Hence, the amount of power and area consumed by the circuit is reduced. While a preferred embodiment of the present invention is shown and described, it is envisioned that those skilled in the art may devise various modifications of the present invention without departing from the spirit and scope of the appended claims.

What is claimed is:

1. A switched capacitor circuit configured to perform a sample and hold operation, said switched capacitor circuit comprising a plurality of capacitors and a plurality of switches, said switched capacitor circuit configured to perform said sample and hold operation via a plurality of states, said states being dependent on clock signals, wherein said switched capacitor circuit is configured such that said clock signals control said switches and a different set of switches are closed in each of the states, wherein said switched capacitor circuit is configured such that said switches are controlled by two clock signals and four signals derived therefrom.

2. The switched capacitor circuit of claim 1, wherein the switched capacitor circuit is configured to perform said sample and hold operation via at least four different states.

3. The switched capacitor circuit of claim 1, wherein said switched capacitor circuit is configured to sample a voltage across a first capacitor while a second capacitor is disconnected from said first capacitor, and is configured to thereafter connect the second capacitor to the first capacitor and discharge possibly at least a portion of a charge held in the first capacitor into the second capacitor, wherein said switched capacitor circuit is configured to perform a sample operation when the second capacitor is disconnected from the first capacitor and is configured to perform a hold operation after the second capacitor is connected to the first capacitor.

4. The switched capacitor circuit of claim 3, wherein said second capacitor behaves like a resistor if said second capacitor does not have a charge stored therein when said second capacitor is connected to the first capacitor.

5. In a switched capacitor circuit, a sample and hold comprising a plurality of passive elements and switches, said sample and hold configured to perform a sample and hold operation via four or more different states wherein a different set of switches are closed in each of the four or more states, wherein said sample and hold is configured such that said switches are controlled by two or more clock signals and four or more signals derived therefrom.

6. The sample and hold of claim 5, wherein said sample and hold is configured to sample a voltage across a first capacitor while a second capacitor is disconnected from said first capacitor, and is configured to thereafter connect the second capacitor to the first capacitor and discharge possibly at least a portion of a charge held in the first capacitor into the second capacitor, wherein said sample and hold is configured to perform a sample operation when the second capacitor is disconnected from the first capacitor and is configured to perform a hold operation after the second capacitor is connected to the first capacitor.

7. The sample and hold of claim 6, wherein said sample and hold is configured to provide that said first capacitor samples $v_{in}(t)$, said second capacitor samples $v_{in}(t+\Delta t)$, and current flows through the second capacitor to a summing node if $\Delta v$ exists between $v_{in}(t)$ and $v_{in}(t+\Delta t)$.

8. A switched capacitor circuit configured to perform a sample and hold operation, said switched capacitor circuit comprising a plurality of capacitors and a plurality of switches, said switched capacitor circuit configured to perform said sample and hold operation via a first number of states, said states being dependent on clock signals, wherein said switched capacitor circuit is configured such that said clock signals control said switches and a different set of switches are closed in each of the states, wherein said switched capacitor circuit is configured such that said switches are controlled by a second number of clock signals and a third number of signals derived therefrom, wherein said first number and said third number are equal.

9. The switched capacitor circuit of claim 8, wherein said second number is one half of said first number.

* * * * *